United States Patent [19]

Vora et al.

[11] 4,168,999

[45] Sep. 25, 1979

[54] METHOD FOR FORMING OXIDE ISOLATED INTEGRATED INJECTION LOGIC SEMICONDUCTOR STRUCTURES HAVING MINIMAL ENCROACHMENT UTILIZING SPECIAL MASKING TECHNIQUES

[75] Inventors: Madhukar B. Vora, Los Gatos; C. Michael Powell, San Jose, both of Calif.

[73] Assignee: Fairchild Camera and Instrument Corporation, Mountain View, Calif.

[21] Appl. No.: 973,350

[22] Filed: Dec. 26, 1978

[51] Int. Cl.² .................... H01L 21/20; H01L 21/22
[52] U.S. Cl. .................... 148/175; 29/578; 148/1.5; 148/187; 156/654; 156/657; 156/659; 156/662; 357/36; 357/46; 357/50; 357/91; 357/92
[58] Field of Search .................... 148/175, 187, 1.5; 357/50, 89, 90, 91, 92, 36, 46; 29/578; 156/654, 657, 659, 662

[56] References Cited

U.S. PATENT DOCUMENTS

| | | | |
|---|---|---|---|
| 3,564,443 | 2/1971 | Nagata | 357/92 X |
| 3,962,717 | 6/1976 | O'Brien | 357/44 |
| 3,993,513 | 11/1976 | O'Brien | 148/175 |
| 4,058,419 | 11/1977 | Tokumaru et al. | 148/187 X |
| 4,110,125 | 8/1978 | Beyer | 148/1.5 |
| 4,110,126 | 8/1978 | Bergeron et al. | 148/1.5 |
| 4,111,724 | 9/1978 | Ogive et al. | 148/175 |
| 4,115,797 | 9/1978 | Hingarh et al. | 357/92 X |

Primary Examiner—L. Dewayne Rutledge
Assistant Examiner—W. G. Saba
Attorney, Agent, or Firm—Alan H. MacPherson; Robert C. Colwell

[57] ABSTRACT

A process for fabricating integrated injection logic structures including both vertical and lateral bipolar transistors in oxide isolated pockets of silicon includes the steps of forming a patterned composite silicon nitride-silicon dioxide layer to serve as a transistor emitter and self-aligned base mask, and introducing desired impurities to form the lateral transistor emitter and collector. The mask is partially removed and additional impurities introduced to form the vertical transistor base and vertical transistor collector.

The process does not require the use of vapor deposited silicon dioxide to pattern the wafer surface, and therefore reduces pinhole defects and the encroachment of the field oxidation on the epitaxial silicon pocket in which devices are formed. The process also results in a flatter topography to allow more uniform and reliable metal interconnections.

12 Claims, 14 Drawing Figures

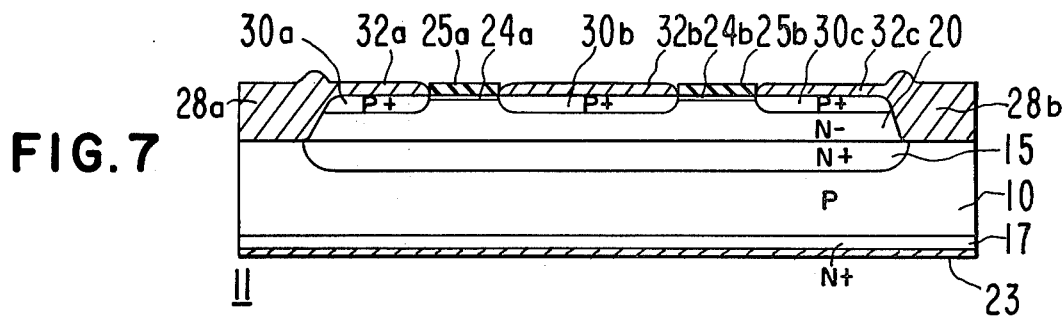
FIG.7
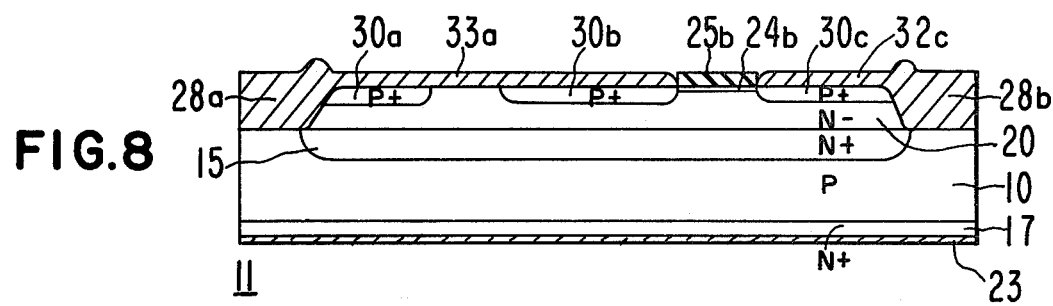
FIG.8
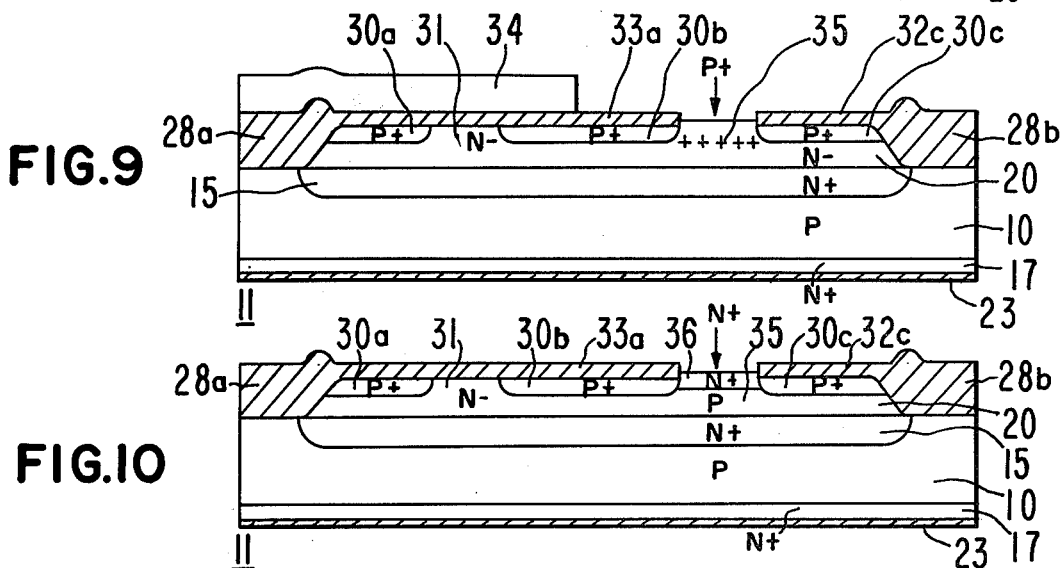
FIG.9
FIG.10
FIG.11
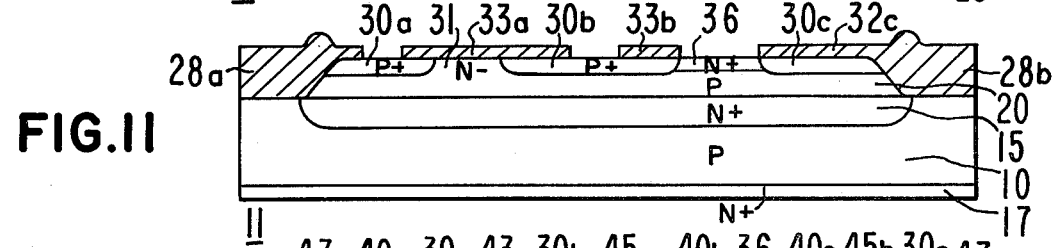
FIG.12

METHOD FOR FORMING OXIDE ISOLATED INTEGRATED INJECTION LOGIC SEMICONDUCTOR STRUCTURES HAVING MINIMAL ENCROACHMENT UTILIZING SPECIAL MASKING TECHNIQUES

BACKGROUND OF THE INVENTION

1. Field of the Invention

This invention relates to a process for fabricating oxide isolated integrated injection logic structures. In particular, the process of the present invention relates to a method for forming oxide isolated vertical bipolar transistors, complementary lateral bipolar transistors, or composite bipolar transistors merging both vertical and lateral bipolar transistors.

2. Prior Art

Integrated circuit structures utilizing injection logic, commonly referred to as I²L (for "integrated injection logic"), are known in the semiconductor arts. In particular, it is known that integrated injection logic structures reduce a gate to a complementary transistor pair which may be integrated into a single device if a lateral transistor is used as a current source for the base of a vertical transistor which is operating in an inverse mode. See, e.g., the references collected in U.S. Pat. No. 3,993,513 issued to O'Brien on Nov. 23, 1976, and titled "Combined Method for Fabricating Oxide Isolated Vertical Bipolar Transistors and Complementary Oxide Isolated Lateral Bipolar Transistors and the Resulting Structures."

Further, semiconductor processing technologies are known which may be utilized to fabricate such oxide isolated structures. See, e.g., the process technology described in O'Brien, supra. Unfortunately, such prior art processing technologies have several drawbacks. Typically such processes utilize several steps in which vapor deposited silicon dioxide (also known as vapox) is used. Applicants have discovered that this use of vapox frequently leads to defects in the semiconductor structure known as pinholes. Additionally, the use of vapox results in an unnecessarily large encroachment silicon pocket. In prior art processes for making I²L structures, the etching of the vapox after etching the epitaxial silicon layer in the field regions would remove much of the thin layer of silicon dioxide typically formed beneath the silicon nitride layer used for masking. This undercutting increased the encroachment of the field oxide into the epitaxial silicon pocket during formation of the field oxide. The encroachment frequently led to an emitter walling effect (described below) which caused an undesirably great amount of emitter-collector leakage. Further, prior art processing technology typically created structures with regions of silicon nitride and vapox remaining on the wafer surface. The presence of these layers created an uneven rough topography which made difficult the subsequent reliable fabrication of metal lines for electrical interconnections.

It is therefore an object of this invention to fabricte oxide isolated integrated injection logic structures in which vapox is not used for defining the various regions in the integrated circuit, in which encroachment of the field oxide into the device regions is minimized, in which a smoother more uniform topography is created, and in which fewer processing steps are used to fabricate a completed device structure.

BRIEF DESCRIPTION OF THE DRAWINGS

FIG. 7 is a further cross-sectional view after doping the lateral transistor emitter and collector regions, and growing a protective layer of silicon dioxide.

FIG. 8 is a further cross-sectional view after diffusing the lateral transistor emitter-collector dopant, and removing a further portion of the silicon nitride layer.

FIG. 9 is a further cross-sectional view after forming a mask for the ion implantation of the vertical transistor base.

FIG. 10 is a further cross-sectional view after doping the collector of the vertical transistor.

FIG. 11 is a further cross-sectional view after removing portions of the silicon dioxide layer overlying the wafer to allow ohmic connections to be made to the wafer surface.

FIG. 12 is a cross-sectional view of the completed semiconductor structure showing the ohmic connection to the wafer surface, the second layer of metal, and the interconnections between the first and second layer of metal.

SUMMARY OF THE INVENTION

A process for fabricating integrated injection logic structures in an oxide isolated pocket of silicon with reduced encroachment, with improved surface topography, and with fewer processing steps, includes the steps of forming over selected regions of the epitaxial silicon, layers of silicon nitride and silicon dioxide to create a mask, introducing impurities into the surface of the epitaxial silicon in regions not covered by the silicon nitride layer, removing additional portions of the silicon nitride layer, forming silicon dioxide in those regions, removing all remaining portions of the silicon nitride layer, forming a new mask to allow impurities to be introduced into those regions beneath the last removed portions of the nitride layer, introducing further impurities into those same regions, and, providing means for making ohmic connections to desired portions of the wafer surface.

The process described does not require the use of vapor deposited silicon dioxide on the wafer surface to define the various device regions, and therefore reduces pinhole generation. Further, the absence of vapox reduces encroachment of the field oxide in the device area. The removal of all silicon nitride and vapox from the wafer surface prior to forming the first layer of metal connections results in a smoother, more uniform topography of the wafer surface and thereby allows more reliable metal interconnection lines.

DETAILED DESCRIPTION

Figure 1:
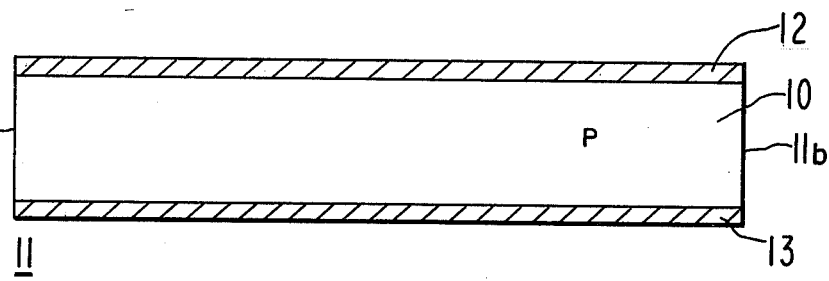
FIG. 1 is a cross-sectional view of a semiconductor substrate having silicon dioxide layers formed on its upper and lower surfaces.

Each step in the process of this invention may be accomplished using known semiconductor technology. A preferred embodiment of the process is described in conjunction with FIGS. 1-12. In FIG. 1 a wafer 11 having a substrate 10 of P-type silicon, with resistivity between 1.5 and 3 ohm centimeters and crystalline orientation 111 is thermally oxidized to create silicon dioxide layers 12 and 13. Substrate 10 is oxidized by being subjected to 120 minutes steam oxidation at 1000° C. This will produce layers of silicon dioxide 12 and 13, each approximately 6000-7000 Angstroms thick. Only a portion of wafer 11 is shown in the drawings. It is well-known that such wafers may be several inches wide and include hundreds or thousands of active and/or passive electronic devices. Although ends 11a and 11b are shown in FIG. 1, it should be understood that the wafer 11 may extend in either or both directions.

Figure 2:
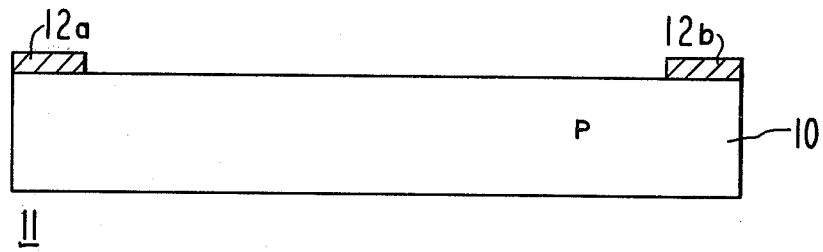
FIG. 2 is a cross-sectional view of the structure shown in FIG. 1 after removal of selected portions of the silicon dioxide layers.
Figure 3:
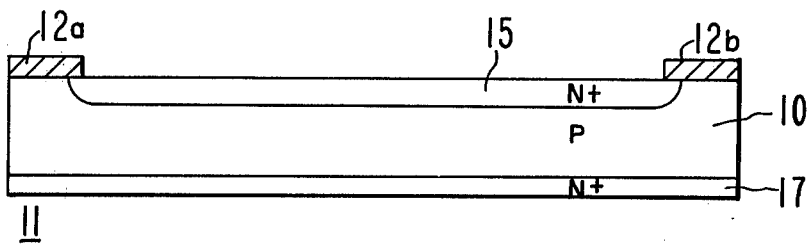
FIG. 3 is a further cross-sectional view showing the buried layer region formed in the surface.
Figure 4:
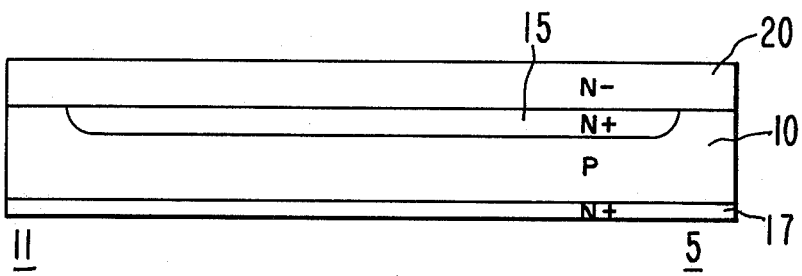
FIG. 4 is a further cross-sectional view after growing of an epitaxial silicon layer.

As shown by FIG. 2 the wafer 11 is then back-sanded to remove the oxide 13, which has acted to getter metallic impurities in substrate 10. A layer of negative photoresist (not shown) is then formed across the upper surface of silicon dioxide layer 12 and suitably patterned using well-known photolithographic techniques. The undesired portions of layer 12, and all of the negative photoresist, are then removed with an etching solution. In the preferred embodiment the wafer 11 is exposed to the etching solution for 8-12 minutes. The etching solution comprises 15 milliliters of hydrofluoric acid (HF), 68 grams of ammonium fluoride ($NH_4F$), and 100 milliliters of water ($H_2O$). After the etching is completed the appearance of wafer 11 will be as shown in FIG. 2. All of layer 13 and the undesired portion of layer 12 have been removed, leaving regions of silicon dioxide 12a and 12b.

Next, to form what will become the buried layer 15 to isolate the silicon pocket and to function as the emitter for what will be an inverted bipolar transistor, a buried layer predeposition step is performed in which wafer 11 is placed in an antimony atmosphere for 55-65 minutes to form N+ conductivity type regions 15 and 17. Note that the antimony atoms diffuse into the exposed surfaces of wafer 10 forming regions 15 and 17. Oxygen is then supplied to wafer 11 for five minutes while the temperature of the structure is ramped to 1250° C. This will create a sheet resistivity for layer 15 of between 20 and 25 ohms per square. The remainder of silicon dioxide layer 12 is then removed using the same solution as described in conjunction with FIG. 2.

After removal of silicon dioxide layer 12, using well-known techniques an N conductivity type epitaxial layer 20 (see FIG. 4) is formed on the surface of substrate 10 and buried layer 15. Using dichlorosilane epitaxial layer 20 will be formed between 1.35 and 1.55 micrometers thick with a resistivity of approximately 10 ohm centimeters.

Phosphorous is then implanted into the epitaxial layer 20 to convert it to N conductivity type. Using well-known ion implantation techniques and an implant energy of 100,000 electron volts an ion concentration of phosphorous of $2.5 \times 10^{12}$ ions/$cm^2$ is created in the epitaxial layer. This will result in a sheet resistivity of approximately 4500-6800 ohms per square. A layer of silicon dioxide 24 approximately 400-550 Angstroms thick is formed on the surface of layer 20, by oxidizing the silicon 20 at 1000° C. A layer of silicon nitride ($Si_3N_4$) 25 approximately 1425-1575 Angstroms thick is then formed on the surface of oxide 24 by any well-known technique, for example, vapor deposition. Finally, a very thin layer 26 of silicon dioxide is formed on the surface of silicon nitride 25 by exposing the silicon nitride 25 to 1000° C. steam oxidation for one hour. This will result in a layer 26 of silicon dioxide on the order of 100 Angstroms thick being formed on the upper surface of silicon nitride 25.

The very thin oxide 26, nitride 25, oxide 24, and epitaxial silicon 20 are then patterned to create what will become oxide isolation regions using the following steps. First, a layer of negative photoresist (not shown) is formed across the upper surface of the very thin oxide 26. The photoresist is exposed and developed, and serves as a mask for oxide 26. The oxide 26 is etched using the same techniques as discussed in conjunction with FIG. 2. Then the silicon nitride is etched using phosphoric acid ($H_2PO_5$) for about one hour. The wafer 11 is dipped in hydrofluoric (HF) acid to remove the oxide layer 24. Next approximately 5200-5600 Angstroms of epitaxial silicon layer 20 are removed using a silicon etch solution. One example of a suitable silicon etching solution is a solution of one milliliter hydrofluoric acid, five milliliters $HNO_3$, and three milliliters of acetic acid. As a result of the oxidation processes accomplished in conjunction with growing thin oxide 24, and very thin oxide 26 on the surface of the silicon nitride layer 25, a region of silicon dioxide 23 will form on the lower surface of the semiconductor structure.

Figure 5:
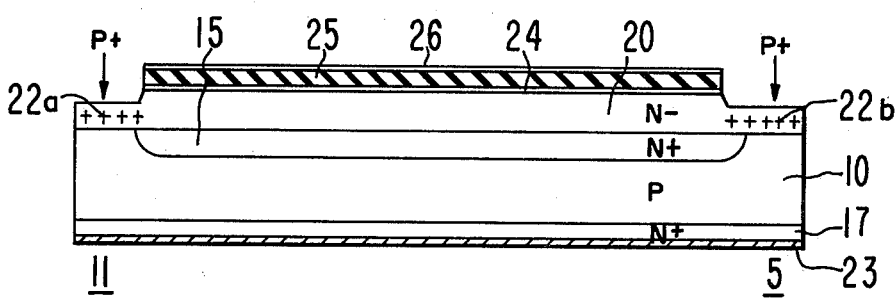
FIG. 5 is a further cross-sectional view after forming silicon nitride and silicon dioxide masking layers, etching the epitaxial silicon, and doping the field oxide regions.

Next, as shown in FIG. 5, ion implantation is used to implant P+ conductivity type material, usually boron, into regions 22a and 22b of epitaxial silicon layer 20. These regions may be formed using an ion implantation of 20,000 electron volts and boron doping to create an ion concentration of $1.2 \times 10^{14}$ ions/$cm^2$.

Figure 6:
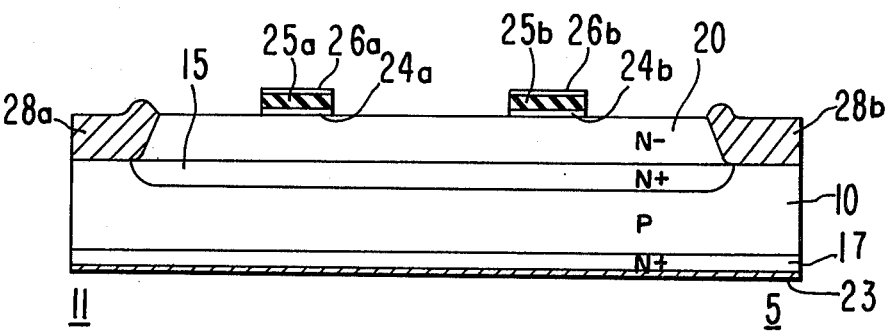
FIG. 6 is a further cross-sectional view after forming the field oxide, and etching portions of the silicon nitride masking layer.

Next, as shown in FIG. 6, the field oxidation 28a and 28b is formed. In the preferred embodiment this is accomplished by oxidizing the wafer 11 at 1000° C. for 270 minutes with pure nitrogen and then for 10 hours with steam. The result will be a silicon dioxide layer 28 which is 1.3 to 1.7 micrometers thick and has a sheet resistivity of approximately 4000-6400 ohms per square. The oxide isolation regions 28a and 28b typically will be closed loops of material which surround regions of the epitaxial layer 20 in which active and/or passive semiconductor components will be formed. In this manner groups of components may be electrically isolated from each other. Additional information concerning oxide isolation may be found in U.S. Pat. No. 3,648,125 entitled "Method of Fabricating Integrated Circuits with Oxidized Isolation and the Resulting Structure," issued to Peltzer. The effect of the creation of field oxide regions 28a and 28b on the surrounding semiconductor structure is shown in further detail in FIG. 13, and is discussed in conjunction with that figure.

Nitride layer 25 and oxide layer 24 are then selectively removed by forming a layer of negative photoresist (not shown) on the upper surface of layer 26. As previously described, the photoresist is used to mask and define the very thin oxide layer 26 on the upper surface of region 25, which is then etched to form a mask for the etching of nitride layer 25. Nitride layer 25 is then etched, typically using a solution of one part hydrofluoric acid to ten parts water which is applied to the wafer surface for 1½ to 2½ minutes. Wafer 11 is dipped in hydrofluoric acid to remove the oxide layer 24. The appearance of the wafer structure at this point in the processing sequence is depicted in FIG. 6.

Boron dopant is then introduced to the wafer surface to form regions 30a, 30b and 30c, as shown in FIG. 7. This is accomplished by bubbling nitrogen through a boron bromide liquid solution and exposing the wafer surface to this saturated nitrogen at approximately 1000° C. to create regions 30a, 30b, and 30c. Next, regions 32a, 32b, and 32c of silicon dioxide are formed across the surface of the impurity diffusions 30a, 30b, and 30c, by a low temperature oxidation process in which wafer 11 is subjected to 800° C. steam oxidation. This oxidation will not be sufficient to create oxide on the surface of nitride layer 25.

As shown in FIG. 8 regions 30a, 30b and 30c are then diffused further into epitaxial layer 20 by thermal diffusion. In the preferred embodiment this is accomplished by heating wafer 11 to 1000° C. for 25 minutes in a steam environment. The sheet resistivity of the P type regions 30 will depend upon the end use of the circuit structure being formed. For example, for the Fairchild 9440 microprocessor this sheet resistivity will be between approximately 180-230 ohms per square, while for other products the sheet resistivity will be lower, approximately 135-180 ohms per square. A layer of negative photoresist (not shown) is then formed across the surface of the wafer to provide a mask for the removal of nitride 25a and oxide 24a. The photoresist is patterned using photolithographic techniques and the nitride layer 25a and oxide layer 24a are removed using the techniques described above in conjunction with FIG. 5. Wafer 11 is then subjected to an additional oxidation process at 1000° C. for 25 minutes in steam to create oxide layer 33a which will be approximately 3400-4000 Angstroms thick.

Next, as shown in FIG. 9, nitride 25b and oxide 24b are removed and a thick region of negative photoresist is formed across selected portions of the wafer surface to serve as a mask for the ion implantation of the base region of the vertical transistor. Typically photoresist layer 34 will be on the order of 1.2 micrometers thick. Base region 35 is then implanted into desired portions of the wafer structure by ion implantation with boron at 190,000 electron volts to create an ion density of $8 \times 10^{12}$ ions/cm$^2$. The sheet resistivity of the base regions thereby formed will be on the order of 2200-3000 ohms per square. The boron introduced into regions 30b and 30c does not alter the conductivity type of these regions. Region 35 is then annealed by heating the wafer structure for 120 minutes in nitrogen to 1000° C.

N conductivity type impurity, typically phosphorous, is then diffused to form collector 36 by subjecting the wafer to phosgene (PH$_3$) gas at 930° C. to produce sheet resistivities on the order of 19-23 ohms per square. A dip in diluted hydrofluoric acid, typically 1-10 solution is then used to clean the upper surface of the wafer, and to remove silicon dioxide layer 23.

Next, a negative photoresist mask (not shown) is formed across the surface of wafer 11 to define the openings for electrical contact. These openings are created by etching openings to desired underlying portions of the wafer, for example, as shown in FIG. 11 over regions 30a, 30b and 36. The appearance of the structure following this masking and etching operation is depicted in FIG. 11.

Using a sputtering process, the first layer of metal 40 is deposited on the surface of wafer 11 to a thickness of approximately 0.70-0.80 micrometers. This first layer of metal 40, typically an alloy of aluminum, copper, and silicon, is then patterned by covering it with a layer of positive photoresist (not shown), exposing and developing the photoresist, and then etching the metal away. In the preferred embodiment the metal is etched away using a mixture of nitric acid and phosphoric acid to slope the edges of the metal layer 40, as may be seen at each edge of metal regions 40a, 40b, and 40c. The phosphoric acid will etch the metal, while the nitric acid is added to the phosphoric acid to cause the photoresist to peel off the surface of the metal and allow a ramp-shaped contour. A layer 43 of phosphorous doped vapox 43 approximately 6000-7200 Angstroms thick is then applied across the surface of the semiconductor structure. This layer will later serve as a dielectric to separate the second layer of metal from underlying portions of the semiconductor structure where ohmic connections are not desired. Via openings, for example, over region 40b, are then made in the vapox layer 43 to allow connections between selected portions of the second layer of metal 45 and the first layer of metal 40. One such via opening appears in FIG. 12 above first layer metal 40b. The openings in the vapox are made using conventional vapox etching solutions.

The second layer of metal is then formed across the surface of the vapox and in the via openings, using a sputtering process to deposit 1.2-1.4 micrometers of aluminum-silicon-copper metal. Metal layer 45 is then masked using a positive resist, and is etched using phosphoric acid to create metallic regions 45a and 45b in desired locations on the surface of vapox 43a and 43b. In those locations where via openings have been made, second layer metal 45 will contact first layer metal 40. For example, note the connection between second layer metal region 45a and first layer metal region 40b. In other regions, however, second layer metal 45 will not be allowed to contact the underlying surface. See, for example, metal region 45b. After the second layer of metal is formed and suitably defined, both the first and second layers of metal are alloyed by heating wafer 11 for 60 minutes to 450° C. Finally, a scratch protection surface is applied by first applying 6000-7200 Angstroms of phosphorus doped vapox 47, followed by a thick layer of negative photoresist 48. The completed integrated injection logic semiconductor structure is shown in cross-sectional view in FIG. 12.

The structure shown in FIG. 12 includes a lateral transistor having emitter 30a, base 31, and collector 30b; and a vertical transistor having emitter 15, base 20, and collector 36. The collector 30b is connected to base 20.

Figure 13:
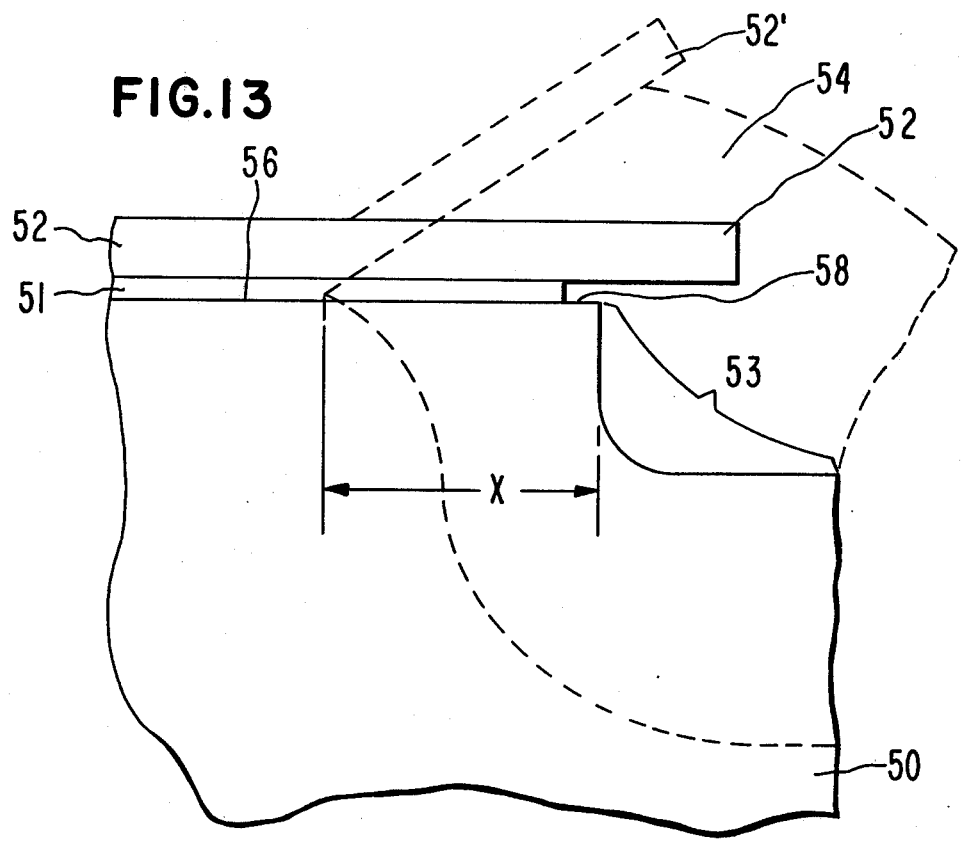
FIG. 13 is an expanded view of a portion of FIGS. 5 and 6 showing the minimal encroachment of the field oxide on the device area which results from the process of this invention.
Figure 14:
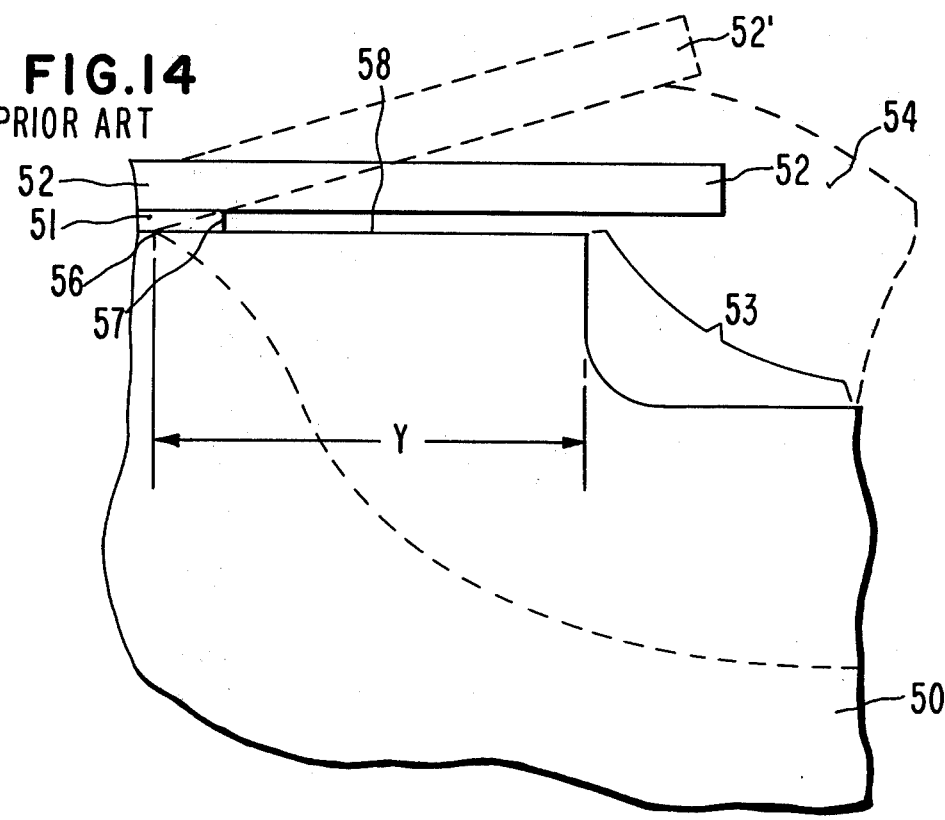
FIG. 14 is an expanded view of a region of a prior art structure for comparison with FIG. 13.

One advantage of the process of this invention is more readily apparent by comparing FIGS. 13 and 14. FIGS. 13 and 14 each show a semiconductor substrate 50, which corresponds to substrate 10 shown in FIGS. 1-12. Also shown is silicon dioxide layer 51 and silicon nitride layer 52. These layers correspond to layers 24 and 25 respectively, also shown in FIGS. 5-8. The solid lines in each of FIGS. 13 and 14 represent the appearance of the semiconductor structure prior to oxidation of region 53, while the dashed portion of the figures represent the appearance of the semiconductor structure after oxidation of region 53. (Region 53 has been created by virtue of the silicon etching process which is described in conjunction with FIG. 5). Because the silicon dioxide created by oxidizing region 53 occupies a greater volume than the silicon 50 being oxidized, the silicon nitride layer 52 will be lifted from the surface of the wafer and occupy a new position 52' as shown in each of FIGS. 13 and 14. This effect creates what has become known in semiconductor technology as the "bird beak effect," because of its resemblance to the appearance of a bird's beak. See the encircled region designated FIG. 13 which is shown in FIG. 6.

Because the silicon oxidation process is relatively isotropic, the boundary between the silicon 50 and the silicon dioxide 54 will move both laterally and vertically. As shown in FIGS. 13 and 14 the boundary moves laterally to the left, and downward. The distance which the boundary moves laterally along surface 56 is as encroachment, and is designated by dimension X in FIG. 13 and dimension Y in FIG. 14. As the amount of encroachment increases the size of the overall semiconductor structure must be increased to maintain a constant useful area in which to fabricate devices.

In prior art processing technology as shown by FIG. 14 vapor deposited silicon dioxide (not shown) was etched after the silicon grooves 53 were formed in the wafer surface. This etching process would also etch the silicon dioxide layer 51 beneath silicon nitride layer 52. As shown in FIG. 14 this results in a relatively larger amount of the surface 58 of silicon 50 being exposed. Therefore, when silicon dioxide 54 is formed, the encroachment distance into the device area becomes much greater. Compare distance Y in FIG. 14 with distance X in FIG. 13. Although FIGS. 13 and 14 are merely schematic representations to depict this effect, Applicants have discovered that the absence of vapox, and the resultant lack of need to etch layer 51 reduces encroachment by a factor of 2 to 1 in comparison with prior art technology.

Further, applicants have discovered that the reduction of the encroachment distance eliminates emitter walling effects which frequently cause emitter-collector leakage in devices formed using prior art processes. The emitter-collector leakage is caused by shorting of the emitter and collector by N type material on the side of the wall.

Further, as shown by FIGS. 9–12, the process of this invention results in a semiconductor structure not having regions of silicon nitride 25 remaining on the surface thereof. Prior art processing technology typically created structures in which regions of nitride remained on the surface of the wafer. See, e.g., FIG. 16 of O'Brien, supra. These regions of silicon nitride created an uneven topography on the surface of the wafer making difficult the fabrication of continuous reliable metal interconnections.

What is claimed is:

1. A process for fabricating integrated injection logic semiconductor structures in an epitaxial silicon layer of first conductivity type overlying a buried layer of first conductivity type, said process comprising:
    forming an insulating layer over both a first and a second region of a substantially planar surface of the epitaxial silicon layer,
    introducing first dopant of second conductivity type into all of the planar surface except the first and the second region,
    forming insulating material over all of the planar surface into which first dopant was introduced,
    removing the insulating layer from the first region,
    forming insulating material over said first region,
    removing the insulating layer from the second region,
    introducing second dopant of second conductivity type into the second region,
    introducing third dopant of first conductivity type into the second region, and
    providing ohmic connections to selected portions of the substantially planar surface.

2. A process as in claim 1 wherein the insulating layer comprises two layers, a second layer atop a first layer, and the first layer is silicon dioxide and the second layer is silicon nitride.

3. A process as in claim 2 wherein the insulating material is silicon dioxide.

4. A process as in claim 3 wherein:
    the first layer and the insulating material are formed by thermal oxidation, and wherein the step of removing the insulating layer from the first region, and the step of removing the insulating layer from the second region are performed by an etching process.

5. A process as in claim 1 wherein the step of introducing first dopant and the step of introducing third dopant are performed by a diffusion process, and the step of introducing second dopant is performed by ion implantation.

6. A process as in claim 1 wherein the first conductivity type material is N conductivity type material.

7. A process as in claim 1 wherein the first conductivity type material is P conductivity type material.

8. A process as in claim 1 wherein the step of providing ohmic connections comprises the steps of:
    making openings to the first region, to the second region, and to two noncontiguous regions of the planar surface separated by the first region,
    patterning a first layer of metal on the upper surface of the semiconductor structure,
    forming a layer of insulation over selected portions of the semiconductor structure and the first layer of metal, and
    patterning a second layer of metal over the surface of the semiconductor structure.

9. A process as in claim 1 wherein the epitaxial layer is surrounded by insulation extending to the buried layer.

10. A process as in claim 9 wherein the insulation which extends to the buried layer is formed by the steps of:
    forming the insulating layer over all portions of the epitaxial layer except where insulation is desired,
    removing a portion of the epitaxial layer in those regions where insulation is desired,
    introducing fourth dopant of first conductivity type into those portions of the epitaxial layer exposed by the step of removing a portion of the epitaxial layer, and
    forming insulation on the portions of the epitaxial layer exposed by the step of removing a portion of the epitaxial layer.

11. A process for fabricating oxide isolated integrated injection logic semiconductor structures comprising:
    forming in a substrate of first conductivity type material a buried layer region of opposite conductivity type,
    forming an epitaxial layer having a substantially planar upper surface on the substrate and on the buried layer region, forming an insulating layer over both a first and a second region of the substantially planar surface, both of said first and second regions at least partially overlying said buried layer region, removing the insulating material from those portions of the epitaxial layer where insulation is desired, removing a portion of the epitaxial layer in those regions where insulation is desired, introducing fourth dopant of first conductivity type into those portions of the epitaxial layer exposed by the step of removing a portion of the epitaxial layer, forming insulation on the portions of the epitaxial layer exposed by the step of removing a portion of the epitaxial layer, removing the insulating material from all of the epitaxial layer except over both the first and the second regions, introducing first dopant of second conductivity type into all of the planar surface except the first and the second region, forming insulating material over all of the planar surface into which first dopant was introduced, removing the insulating layer from the first region, forming insulating material over said first region, removing the insulating layer from the second region, introducing second dopant of second conductivity type into the second region, introducing second dopant of second conductivity type into the second region, introducing third dopant of first conductivity type into the second region, and providing ohmic connections to selected portions of the substantially planar surface.

12. A process as in claim 11 wherein the insulating layer comprises two layers, the second layer atop the first, and the first layer is silicon dioxide and the second layer is silicon nitride.

* * * * *